US007889501B2

(12) United States Patent
Shioiri et al.

(10) Patent No.: US 7,889,501 B2
(45) Date of Patent: Feb. 15, 2011

(54) COIL ASSEMBLY, SWITCHING POWER SUPPLY, AND PROJECTOR

(75) Inventors: Kenichi Shioiri, Matsumoto (JP); Masahide Tsuda, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/535,552

(22) Filed: Aug. 4, 2009

(65) Prior Publication Data

US 2010/0033928 A1 Feb. 11, 2010

(30) Foreign Application Priority Data

Aug. 5, 2008 (JP) ............................ 2008-202188

(51) Int. Cl.
*H05K 7/20* (2006.01)

(52) U.S. Cl. ....................... 361/707; 361/704; 361/719; 165/80.3

(58) Field of Classification Search ....................... None
See application file for complete search history.

(56) References Cited

U.S. PATENT DOCUMENTS

| | | | | |
|---|---|---|---|---|
| 5,030,889 | A * | 7/1991 | El-Hamamsy et al. | 315/200 R |
| 6,344,781 | B1 * | 2/2002 | Slenker | 333/181 |
| 7,352,270 | B1 * | 4/2008 | Copeland | 336/200 |
| 7,471,181 | B1 * | 12/2008 | MacLennan | 336/229 |
| 7,524,206 | B2 * | 4/2009 | Gutierrez et al. | 439/607.01 |

FOREIGN PATENT DOCUMENTS

| | | | |
|---|---|---|---|
| JP | 05-093094 | U | 12/1993 |
| JP | 06-011316 | U | 2/1994 |
| JP | 06-036951 | A | 2/1994 |
| JP | 6-44123 | U | 6/1994 |
| JP | 10-41165 | A | 2/1998 |
| JP | 2000-228310 | A | 8/2000 |
| JP | 2000-228320 | A | 8/2000 |
| JP | 2001-326126 | A | 11/2001 |
| JP | 2003-234215 | A | 8/2003 |
| JP | 2005-286066 | A | 10/2005 |
| JP | 2007-234752 | A | 9/2007 |
| JP | 2007-235054 | A | 9/2007 |

* cited by examiner

*Primary Examiner*—Boris L Chervinsky
(74) *Attorney, Agent, or Firm*—AdvantEdge Law Group, LLC

(57) ABSTRACT

A switching power supply includes: a coil; and a pedestal fixed to the coil, the pedestal includes a supporting member configured to support the coil in such a manner as to form a space through which air flows on a surface of the coil attached to the pedestal.

13 Claims, 10 Drawing Sheets

FIRST EMBODIMENT

COMPARISON EXAMPLE

FIRST EMBODIMENT

COIL ASSEMBLY, SWITCHING POWER SUPPLY, AND PROJECTOR

CROSS REFERENCE TO RELATED APPLICATIONS

The present application claims priority from Japanese Patent Application No. 2008-202188 filed on Aug. 5, 2008, which is hereby incorporated by reference in its entirety.

BACKGROUND

1. Technical Field

The present invention relates to a technology of cooling a coil.

2. Related Art

A switching power supply such as DC-converter uses a choke coil for smoothing current and boosting voltage. This choke coil is generally constituted by a toroidal coil which has windings wound around a doughnut-shaped toroidal core. The windings of the toroidal coil are exposed on the outer periphery of the coil. Therefore, when the toroidal coil is directly attached to a substrate, wiring pattern cannot be provided on a surface where the toroidal coil is mounted in the vicinity of the toroidal coil for securing sufficient insulation. For increasing the degree of freedom of the wiring pattern, the toroidal coil is attached to an insulating plate member (pedestal), and the coil attached to the pedestal (coil assembly) is mounted on the substrate (for example, see JP-A-6-44123, JP-A-2007-235054, JP-A-2007-234752, JP-A-2005-286066, JP-A-2001-326126, and JP-A-2000-228320).

Since the choke coil included in the switching power supply is disposed on the source current path, a relatively high current flows in the choke coil. Thus, Joule heat is generated on the windings of the choke coil due to winding resistance, and the temperature of the choke coil rises. According to the known coil assembly which has the coil attached to the plate-like pedestal, however, efficiency of cooling the coil is not sufficiently high. This problem arises not only from the coil assembly containing the toroidal coil but also from various types of coil assembly included in the switching power supply and the like.

SUMMARY

It is an advantage of some aspects of the invention to provide a technology of increasing efficiency of cooling a coil.

A coil assembly according to an aspect of the invention includes a coil, and a pedestal fixed to the coil. The pedestal includes a supporting member configured to support the coil in such a manner as to form a space through which air flows on a surface of the coil attached to the pedestal.

According to this structure, a space through which air can flow on the surface of the coil attached to the pedestal is produced by the supporting member provided on the pedestal. Thus, the surface of the coil attached to the pedestal is cooled as well, and efficiency of cooling the coil improves.

It is preferable that the coil is a toroidal coil, and that the pedestal configured to support the coil such that the toroidal direction of the coil being substantially parallel with a substrate on which the coil assembly is provided.

In this structure, the area of the coil surface facing the space increases by disposing the toroidal surface of the toroidal coil substantially parallel with the substrate. Thus, cooling of the coil can be further promoted by air passing through the space.

It is preferable that the pedestal includes a plate-like portion contacting the substrate, and that the supporting member extends in the direction opposite to the substrate from the plate-like portion.

According to this structure, the coil assembly can be more easily attached to the substrate by providing the plate-like portion on the pedestal.

It is preferable that a through hole penetrated through the coil side and the substrate side is provided on each of the plate-like portion and the substrate in an area containing a position corresponding to a hole of the coil.

According to this structure, a through hole penetrated through the coil side and the substrate side is provided on each of the plate-like portion and the substrate in an area containing a position corresponding to a hole of the coil Thus, air flowing through the through hole of the plate-like portion and the hole of the toroidal coil can be easily generated. Accordingly, efficiency of cooling the coil can increase.

In this case, it is more preferable that a through hole is similarly formed on the substrate as well as on the plate-like portion. By providing the through hole on the substrate, air passing through the through hole of the substrate and the hole of the toroidal coil can be generated. Thus, efficiency of cooling the coil can further improves.

It is preferable that the supporting member is made of heat conductive resin.

According to this structure, the supporting member is formed by resin having high heat conductivity. Thus, heat generated by the coil can be released from the supporting member. Accordingly, efficiency of cooling the coil can further increases.

The invention can be practiced in various forms such as a coil assembly and a method of mounting a coil, a power supply using the coil assembly and the method of mounting the coil, a discharge lamp driving device and a light source device including the power supply, and an image display apparatus including the light source device.

BRIEF DESCRIPTION OF THE DRAWINGS

The invention will be described with reference to the accompanying drawings, wherein like numbers reference like elements.

DESCRIPTION OF EXEMPLARY EMBODIMENTS

A. First Embodiment

A1. Structure of Projector

Figure 1:
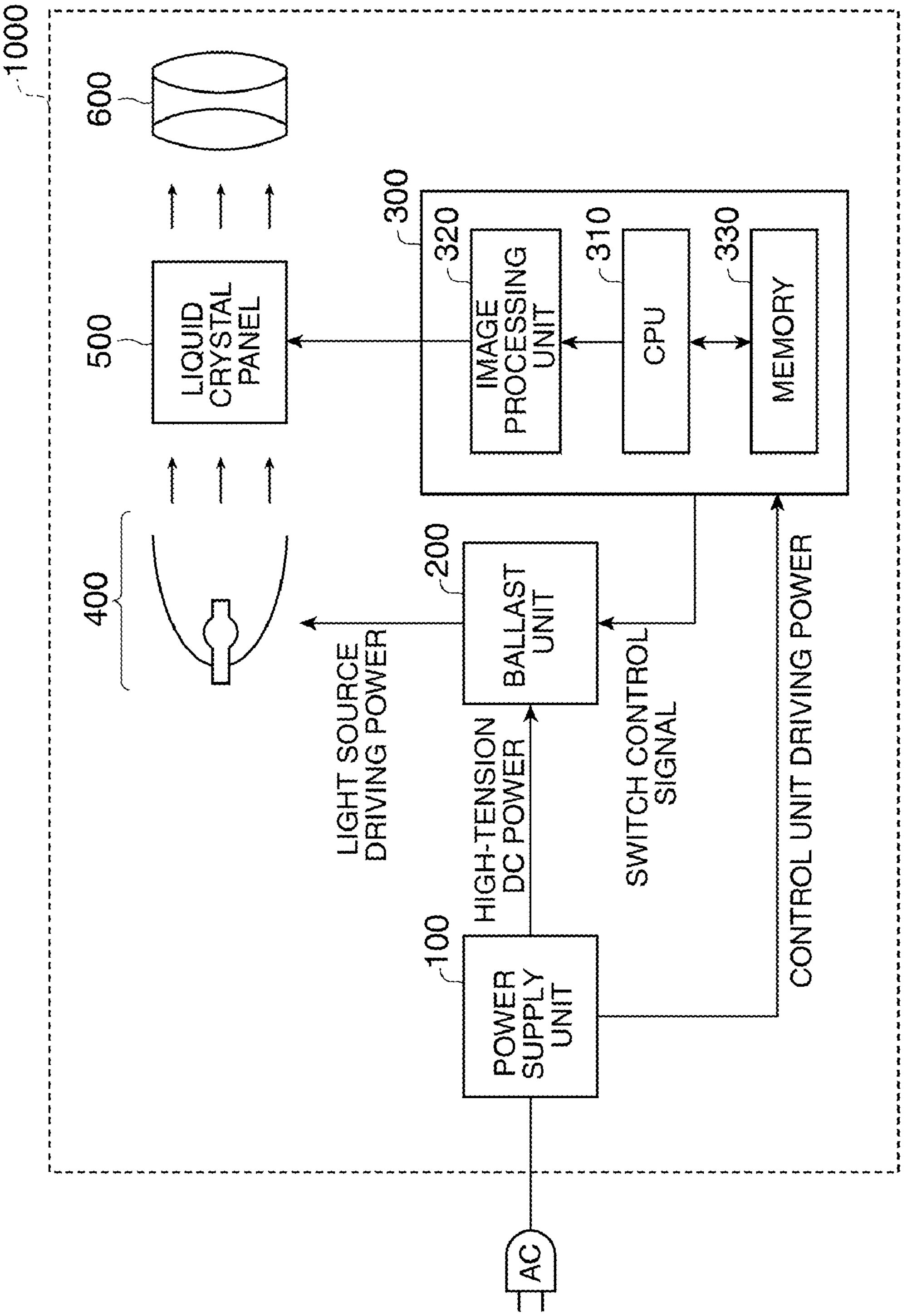
FIG. 1 shows a general structure of a projector including a ballast unit according to a first embodiment of the invention.

FIG. 1 illustrates a general structure of a projector 1000 including a ballast unit according to a first embodiment of the invention. The projector 1000 includes a power supply unit 100, a ballast unit 200, a control unit 300, a light source lamp 400, a liquid crystal panel 500, and a projection lens 600.

The power supply unit 100 generates DC power to be supplied to the respective components of the projector 1000 from commercial power supply such as AC 100V. The power supply unit 100 has a not-shown boosting type converter (boost converter) to generate high tension DC power to be supplied to the ballast unit 200. The boost converter has a not-shown power factor improvement circuit (PFC) so as not to send high-frequency noise generated by switching (chopper process) to the commercial power supply. However, the PFC circuit may be eliminated depending on the characteristics of noise filter or the like provided on the commercial power supply side of the power supply unit 100. The boost converter which boosts voltage by chopper process is referred to as boost chopper as well.

The ballast unit 200 generates light source driving power for driving the light source lamp 400 from the high tension DC power supplied from the power supply unit 100 in response to a switch control signal transmitted from the control unit 300. The light source driving power thus generated is supplied to the light source lamp 400 from the ballast unit 200. Generation of the light source driving power using the ballast unit 200 will be described later.

The control unit 300 includes a CPU 310, an image processing unit 320, and a memory 330. The CPU 310 performs various processes and controls under a computer program stored in the memory 330. The image processing unit 320 applies image processing to image data received from an external device such as PC, DVD player, and external memory connected with an external connector (not shown), for example, and supplies the processed image data to the liquid crystal panel 500. The control unit 300 operates by control unit driving power generated by the power supply unit 100.

The light source lamp 400 is a discharge lamp for supplying light to the liquid crystal panel 500. The liquid crystal panel 500 is a transmission type liquid crystal panel which modulates light emitted from the light source lamp 400 according to image data given from the image processing unit 320. The projection lens 600 projects the light modulated by the liquid crystal panel 500 onto a screen (not shown). By projecting the light modulated by the liquid crystal panel 500 to the screen, an image can be displayed on the screen.

A2. Structure of Ballast Unit

Figure 2:
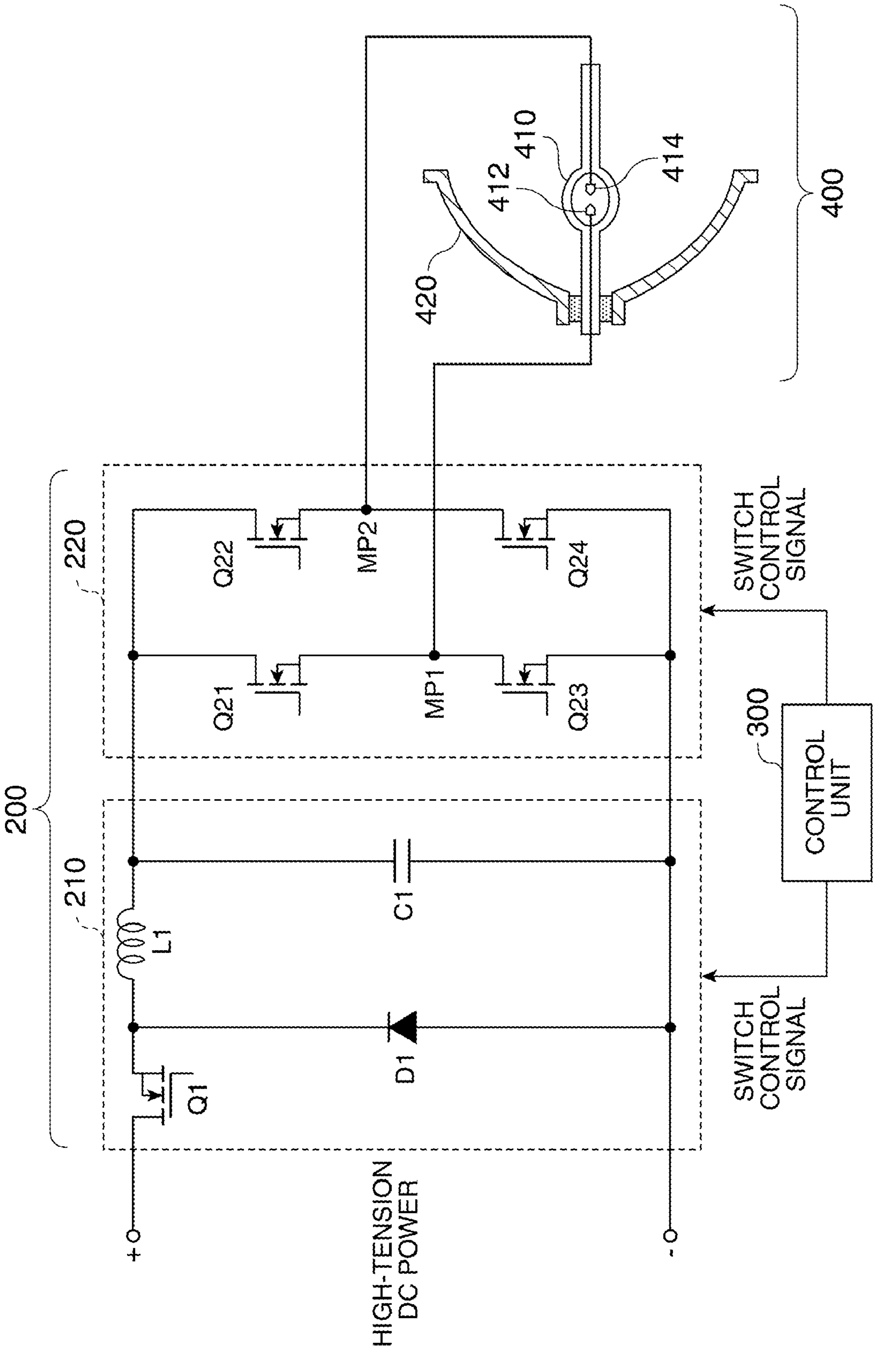
FIG. 2 is a circuit diagram showing an example of the ballast unit.

FIG. 2 is a circuit diagram showing an example of the ballast unit 200 which supplies light source driving current to the light source lamp 400. The ballast unit 200 in the first embodiment includes a down type converter (back converter) 210, and an inverter 220.

The back converter 210 has a switching element Q1, a choke coil L1, a diode D1, and a capacitor C1. The switching element Q1 switches between ON and OFF in response to a switch control signal transmitted from the control unit 300. The high-tension DC power supplied from the power supply unit 100 (FIG. 1) is decreased to voltage appropriate for the light source driving power according to chopper process by controlling the duty ratio of the ON condition of the switching element Q1. The power thus decreased is supplied to the inverter 220. The back converter which decreases voltage by chopper process is referred to as back chopper as well.

The inverter 220 is a full-bridge inverter having four full-bridge-connected switching elements Q21 through Q24. The switching elements Q21 through Q24 also switch between ON and OFF in response to the switch control signal transmitted from the control unit 300. The pair of the switching elements Q21 and Q24 and the pair of the switching elements Q22 and Q23 are alternately turned on to supply AC power having rectangular waves as the power supply driving power to the light source lamp 400 connected with two bridge intermediate points MP1 and MP2.

The light source lamp 400 is a reflection type light source lamp including a high-pressure discharge lamp such as high-pressure mercury lamp and metal halide lamp. The light source lamp 400 has an arc tube 410 fixed to the central portion of a reflection mirror 420 by heat resistance cement. As described above, electrodes 412 and 414 of the arc tube 410 are connected with the two bridge intermediate points MP1 and MP2 included in the inverter 220.

A3. Mounting Choke Coil

Figure 3A:
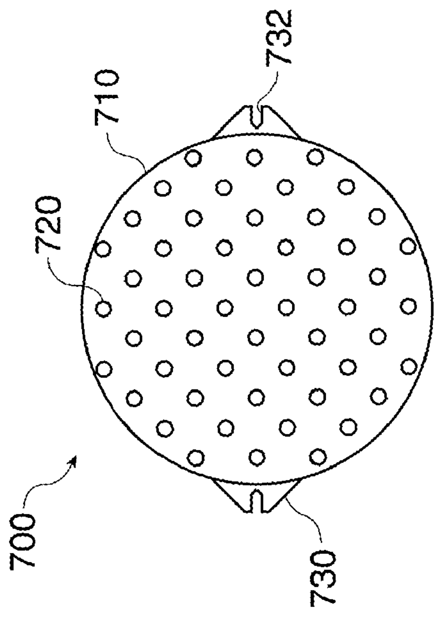
FIGS. 3A through 3D show a condition of a mounted choke coil according to the first embodiment.
Figure 3B:
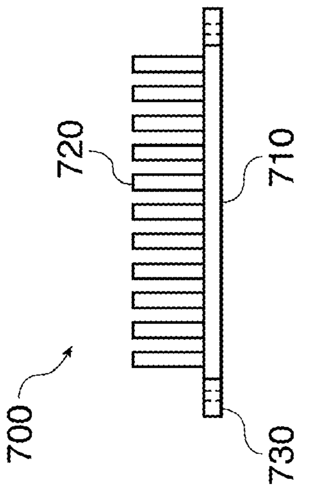
Figure 3C:
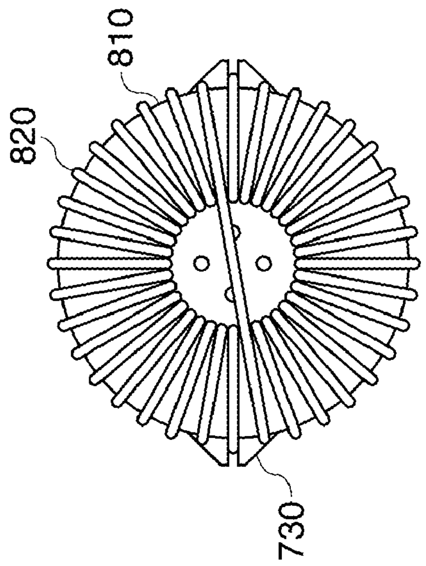
Figure 3D:
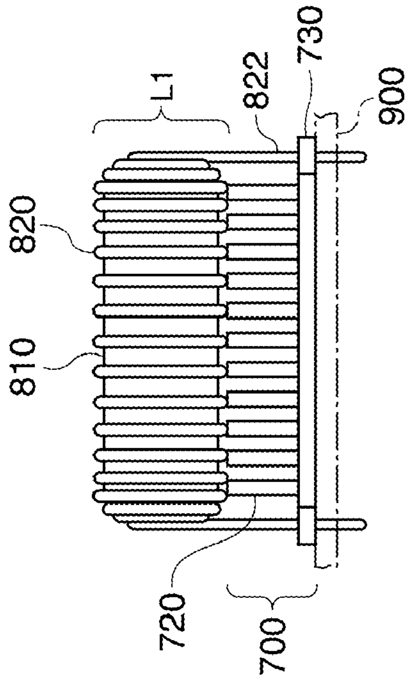

FIGS. 3A through 3D illustrate mounting conditions of a choke coil L1 included in the ballast unit 200 in the first embodiment. FIGS. 3A and 3B show a pedestal 700 on which the choke coil L1 is mounted. FIGS. 3C and 3D illustrate the choke coil L1 disposed on a substrate 900. According to the first embodiment, the choke coil L1 is constituted by a toroidal coil which has windings 820 around a doughnut-shaped toroidal core 810 as shown in FIGS. 3C and 3D. FIGS. 3A and 3C illustrate the pedestal 700 and the choke coil L1 as viewed from the surface (upper surface) on which the choke coil L1 is mounted. FIGS. 3B and 3D illustrate the pedestal 700 and the choke coil L1 as viewed from the side.

As shown in FIGS. 3A and 3B, the pedestal 700 has a disk 710 having approximately the same outside diameter as that of the toroidal core 810, cylindrical pins 720 extended toward the upper surface from the disk 710, and lead holding portions 730 extended in the direction of the outer circumference of the disk 710 from the disk 710. Each of the lead holding portions 730 has a notch 732 extending from the outer circumference toward the center. The pedestal 700 can be integrally formed by injection molding using thermoplastic resin, for example. However, the pedestal 700 is not required to be integrally formed but may be produced by inserting the pins 720 formed separately from the disk 710 and the lead holding portions 730 into the disk 710. Each diameter, length, shape, number, position, and the like of the pins 720 may be varied, and the shape of the plate-shaped disk 710 may be changed to an arbitrary shape such as rectangular shape.

As illustrated in FIGS. 3C and 3D, the choke coil L1 is placed on the pedestal 700 such that the toroidal direction of the toroidal core (i.e., direction of magnetic flux) being parallel with the substrate 900 in the first embodiment. Leads 822 at both ends of the windings 820 are attached to the lead holding portions 730 under the condition of contact between the choke coil L1 and the pins 720. By this arrangement, the choke coil L1 is fixed to the pedestal 700 such that position shift caused by vibration can be prevented. Moreover, the choke coil L1 and the pedestal 700 (collectively referred to as "coil assembly" as well) can be handled more easily by fixing the choke coil L1 to the pedestal 700.

The leads 822 extended from the lead holding portions 730 toward the lower surface project toward the lower surface of the substrate 900 via through holes (not shown) formed on the substrate 900. The leads 822 projecting toward the lower surface are connected with a wiring pattern (not shown) provided on the substrate 900 by soldering or by other methods. According to the first embodiment, the distance between the choke coil L1 and the substrate 900 can be increased by providing the pins 720 on the pedestal 700. Thus, transmission of noise to the wiring pattern disposed close to the choke coil L1 can be prevented.

Figure 4A:
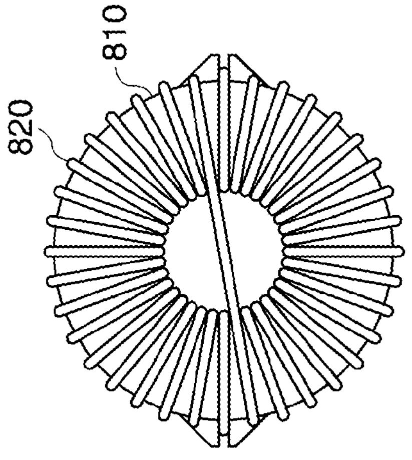
FIGS. 4A through 4D show a pedestal in related art and a pedestal according to the first embodiment disposed between the choke coil and a substrate.
Figure 4B:
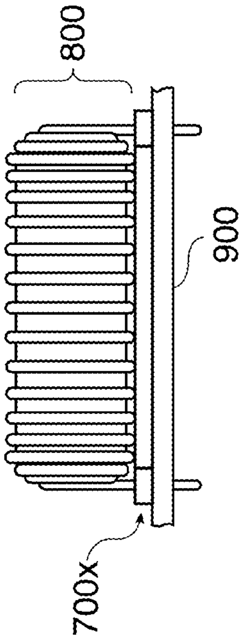
Figure 4C:
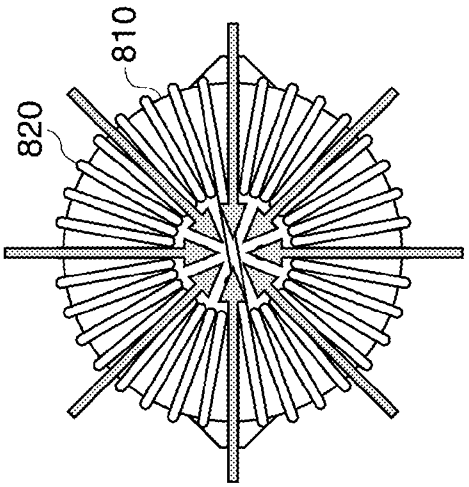
Figure 4D:
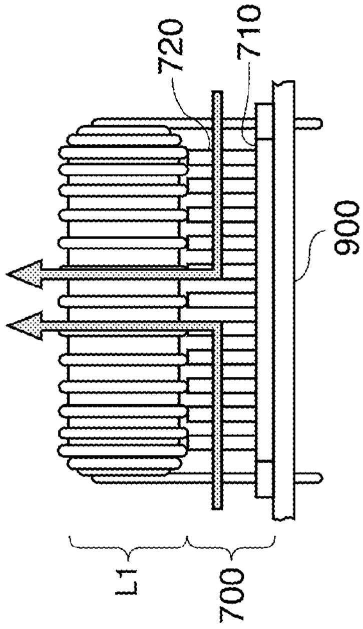

FIGS. 4A through 4D illustrate a pedestal 700*x* in related art and the pedestal 700 in the first embodiment disposed between the choke coil L1 and the substrate 900. FIGS. 4A and 4B show the related-art pedestal 700*x* for insulating the choke coil L1 from the wiring pattern on the upper surface of the substrate 900 as a comparison example. FIGS. 4C and 4D show the condition of the pedestal 700 in the first embodiment. FIGS. 4A and 4C show the pedestals 700*x* and 700 and the choke coil L1 as viewed from the mounting surface (upper surface) of the choke coil L1. FIGS. 4B and 4D show the pedestals 700*x* and 700 and the choke coil L1 as viewed from the side.

As illustrated in FIG. 4B, the choke coil L1 contacts the flat upper surface of the pedestal 700*x* in the related art. Thus, air passing through the center of the choke coil L1 is not generated, achieving substantially no cooling of the choke coil L1 by natural convection. When airflow for cooling the choke coil L1 is supplied from the side, only the upper surface of the choke coil L1 is cooled. Thus, cooling efficiency cannot be easily raised.

According to the first embodiment, however, a space is produced between the choke coil L1 and the disk 710 by the presence of the pins 720 on the pedestal 700. By providing this space, air flowing from the outer circumference toward the center on the lower surface side of the choke coil L1 and flowing upward at the center is generated as indicated by arrows in FIGS. 4C and 4D. Thus, the choke coil L1 in the first embodiment can be sufficiently cooled by natural convection. When airflow for cooling the choke coil L1 is supplied from the side, the air passes along both of the upper surface and the lower surface of the choke coil L1. Thus, both the upper surface and the lower surface of the choke coil L1 are cooled, and cooling efficiency becomes higher than that in case of the comparison example.

According to the first embodiment, therefore, the choke coil L1 can be sufficiently cooled by natural convection. Thus, the degree of freedom for positioning the choke coil L1 within the housing can be increased. Even in case of forced air cooling, efficiency of cooling the choke coil L1 can be similarly raised. Thus, the degree of freedom for disposing the choke coil L1 within the housing can be further improved, and the air flow amount from a cooling fan required for supplying airflow decreases. Accordingly, the entire size of the ballast unit 200 can be reduced by miniaturization of the cooling fan, and power consumption can be decreased by reduction of the power for driving the cooling fan.

The heat generated from the choke coil L1 provided with the toroidal core 810 is chiefly constituted by Joule heat from the windings 820. Thus, rated current of the choke coil L1 is determined by the diameter of the windings 820. Since the cooling of the choke coil L1 is promoted in the first embodiment, the diameter of the windings 820 of the choke coil L1 for the same rated current can be reduced. By reducing the diameter of the windings 820, inductance of the choke coil L1 can be raised with an increased number of windings, and the size of the choke coil L1 can be reduced with miniaturization of the toroidal core 810.

B. Second Embodiment

Figure 5C:
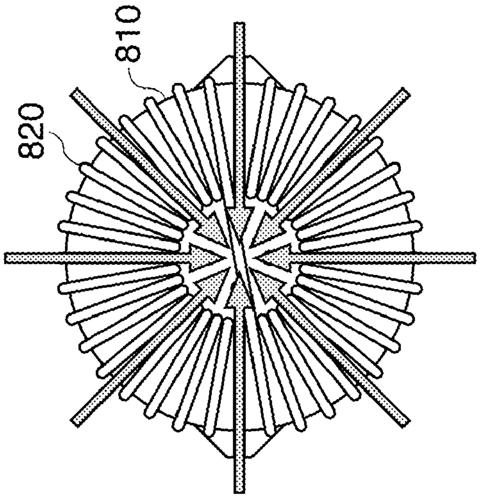
FIGS. 5A through 5D show a condition of a mounted choke coil according to a second embodiment.
Figure 5D:
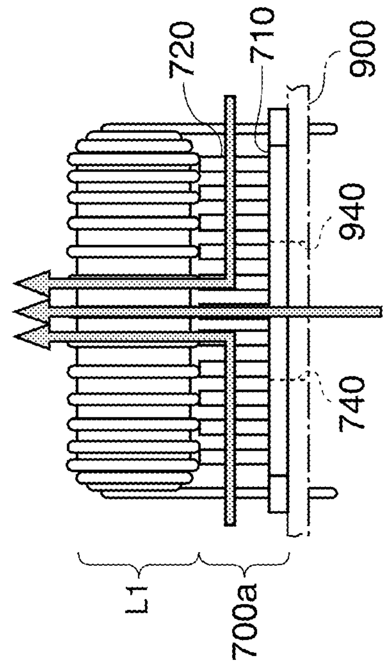
Figure 5A:
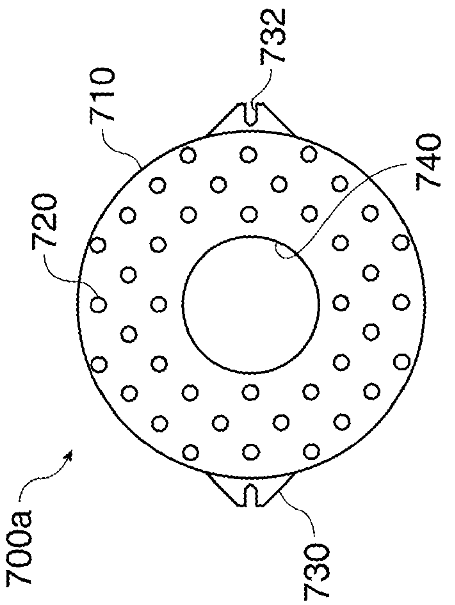
Figure 5B:
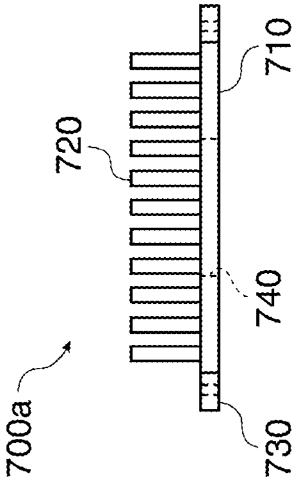
Figure 6A:
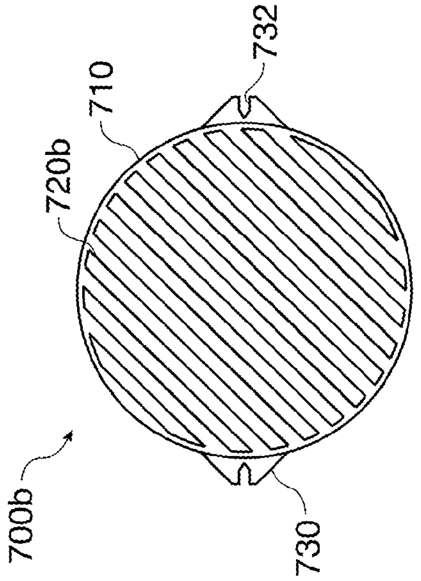
FIGS. 6A through 6D illustrate a pedestal according to a first modified example.
Figure 6B:
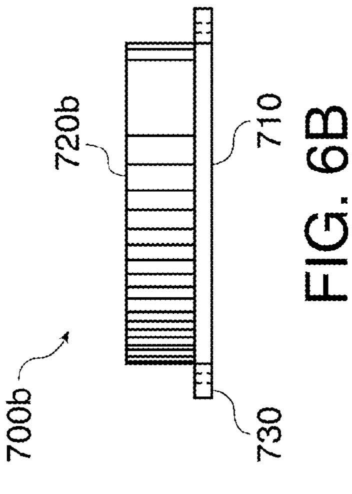
Figure 6C:
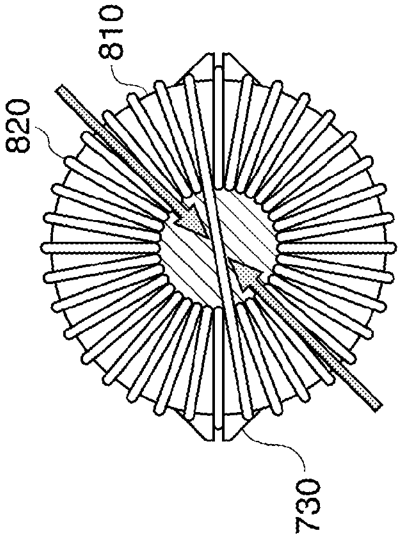
Figure 6D:
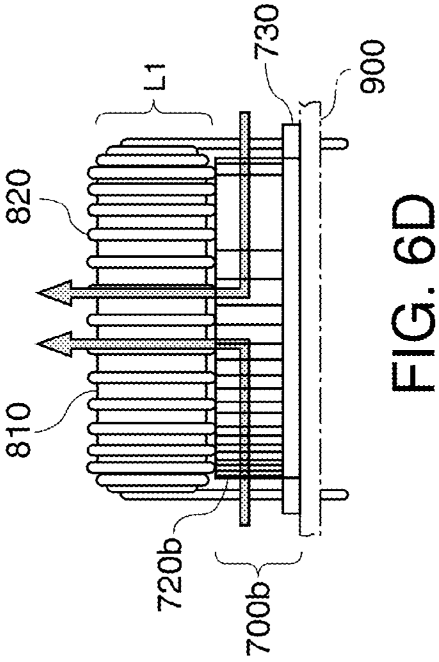

FIGS. 5A through 5D illustrate conditions of the mounted choke coil L1 according to a second embodiment. FIGS. 5A and 5B show a pedestal 700*a* on which the choke coil L1 is placed in the second embodiment. FIGS. 5C and 5D show the condition of the choke coil L1 disposed on a substrate 900*a*.

As shown in FIGS. 5A and 5B, the pedestal 700*a* in the second embodiment is different from the pedestal 700 in the first embodiment shown in FIGS. 3A and 3B in that a through hole 740 is formed at the center of the pedestal 700*a* at a position corresponding to the hole of the choke coil L1. Moreover, as shown in FIGS. 5C and 5D, a through hole 940 corresponding to the through hole 740 formed on the pedestal 700*a* is formed on the substrate 900*a*. Other parts are similar to those in the first embodiment.

According to the second embodiment, air flowing from the lower surface toward the upper surface of the substrate 900*a* is generated as indicated by arrows by providing the through holes 740 and 940 on the pedestal 700*a* and the substrate 900*a*. Thus, efficiency of cooling the choke coil L1 by natural convection further improves. Moreover, by providing projection or the like at a position corresponding to the through hole 940 on the lower part of the substrate 900*a*, airflow for forced air cooling can be guided from the lower surface toward the upper surface of the substrate 900*a* through the through hole 940. In this case, efficiency of cooling the choke coil L1 by forced air cooling further improves.

In the second embodiment, the through holes 740 and 940 having substantially the same diameters as that of the hole of the choke coil L1 are formed. However, the diameters of the through holes 740 and 940 may be larger. Generally, each of the through holes 740 and 940 is only required to penetrate through the upper surface and the lower surface in an area containing the position corresponding to the hole of the choke coil L1.

C. Modified Example of Pedestal

The pedestal on which the choke coil L1 is mounted is not limited to those in the respective embodiments, but may be various types. For example, the supporting members for supporting the choke coil L1 such as the pedestal 700 and the pins 720 may be made of heat conductive resin to conduct heat generated by the choke coil L1 to the pedestal 700 or the pins 720 and thereby improve cooling efficiency. Moreover, the shape of the pedestal may be various shapes as long as a space through which air can pass toward the surface of the choke coil L1 facing the substrates 900 and 900*a*, that is, the surface on the pedestal side can be produced. The shapes of the pedestal are shown in FIGS. 6A through 9B as modified examples.

C1. Pedestal in First Modified Example

FIGS. 6A through 6D illustrate a pedestal according to a first modified example. A pedestal 700*b* shown in FIGS. 6A and 6B according to the first modified example is different from the pedestal 700 in the first embodiment in that plate-like fins 720*b* are provided on the disk 710 in place of the cylindrical pins 720. Other parts are similar to those of the pedestal 700 in the first embodiment shown in FIGS. 3A and 3B. Airflow in the direction along the fins 720*b* can be generated by using the plate-like fins 720*b* shown in FIGS. 6A and 6B. In forced air cooling, airflow can be produced on the lower surface side of the choke coil L1 by adjusting the direction of the fins 720*b* to the cooling airflow direction, and thus efficiency of cooling the choke coil L1 can be sufficiently increased. While the pedestal 700*b* in the first modified example shown in FIGS. 6A through 6D does not have a through hole, a through hole may be formed at the center of the pedestal 700*b* similarly to the second embodiment.

C2. Pedestal in Second Modified Example

Figure 7A:
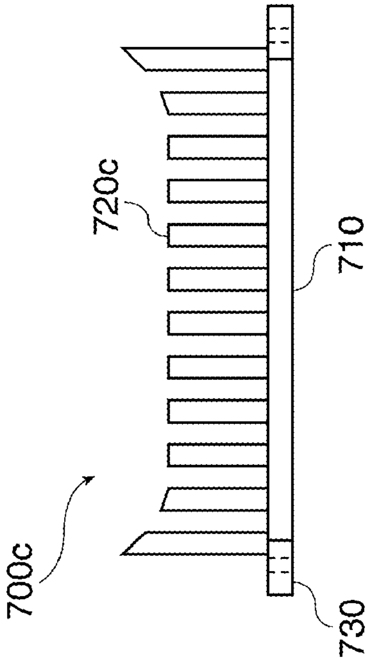
FIGS. 7A and 7B illustrate a pedestal according to a second modified example.
Figure 7B:
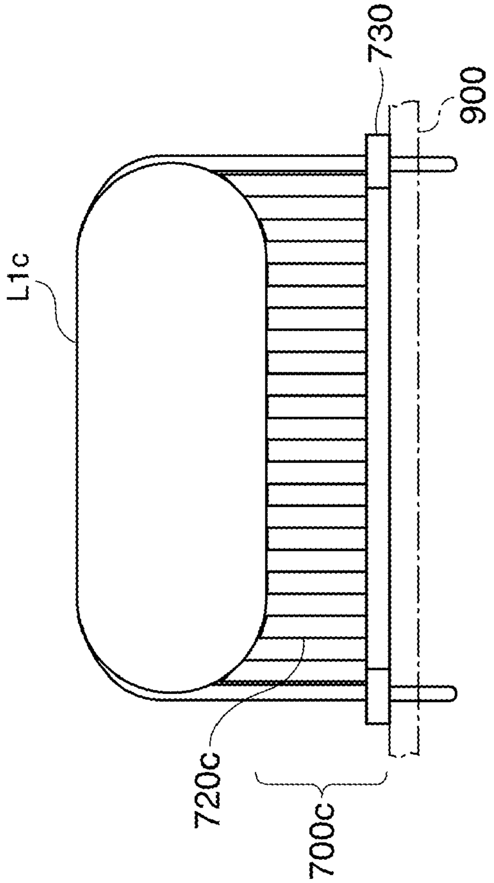

FIGS. 7A and 7B show a pedestal in a second modified example. According to this example shown in FIGS. 7A and 7B, a choke coil L1*c* having substantially circular cross section is used. FIGS. 7A and 7B do not show a toroidal core and windings of the choke coil L1*c*. As shown in FIG. 7A, the shapes of pins 720*c* are varied according to the shape of the choke coil L1*c* depending on the positions of the pins 720*c*. By changing the shapes of the pins 720C according to the shape of the choke coil L1*c*, the choke coil L1*c* can be fixed to a more accurate position on a pedestal 700*c*, and position shift of the choke coil L1*c* can be more securely prevented. It is possible to form a through hole at the center of the pedestal 700*c* in the second modified example shown in FIGS. 7A and 7B similarly to the second embodiment.

C3. Pedestal in Third Modified Example

Figure 8C:
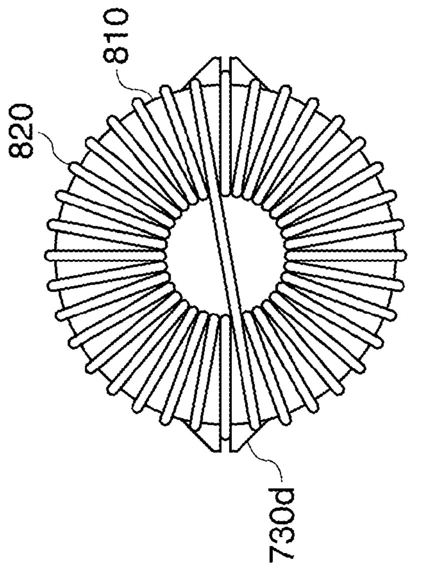
FIGS. 8A through 8D illustrate a pedestal according to a third modified example.
Figure 8D:
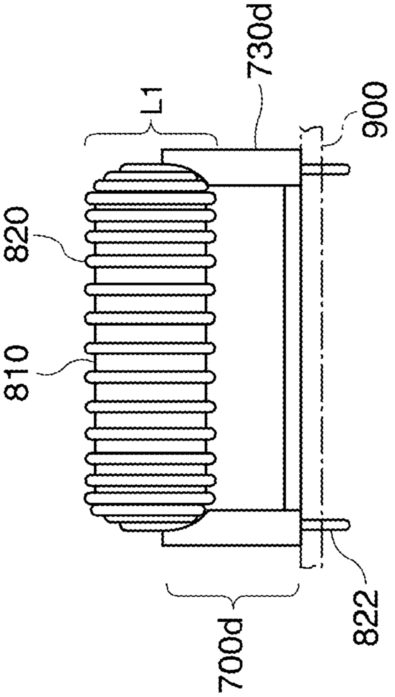
Figure 8A:
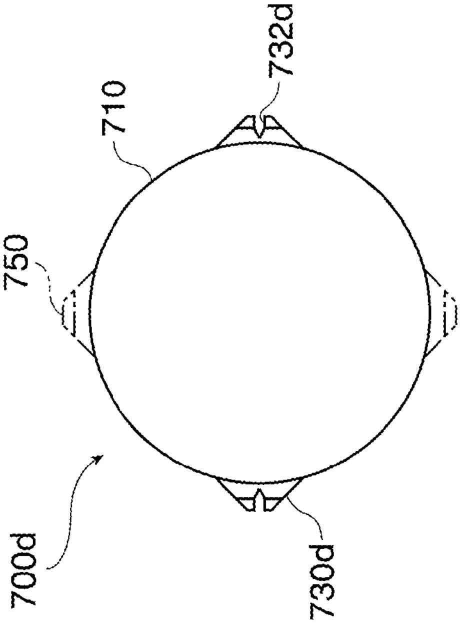
Figure 8B:
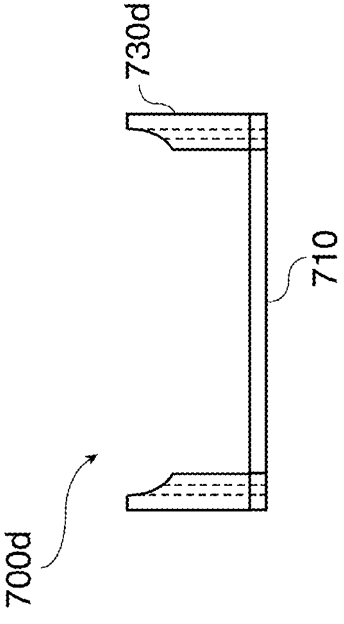

FIGS. 8A through 8D show a pedestal in a third modified example. A pedestal 700*d* in the third modified example shown in FIGS. 8A and 8B is different from the pedestal 700 in the first embodiment shown in FIGS. 3A and 3B in that lead holding portions 730*d* extend toward the upper surface and that pins 720 are removed. According to the third modified example, the choke coil L1 is supported by the lead holding portions 730*d* extended toward the upper surface as shown in FIGS. 8C and 8D. In the third modified example, a space through which air can pass is produced on the lower surface of the choke coil L1 similarly to the first embodiment. Thus, cooling the choke coil L1 can be promoted similarly to the first embodiment. It is possible to form a through hole at the center of the pedestal 700*d* in the third modified example shown in FIGS. 8A through 8D similarly to the second embodiment.

According to the third modified example, the choke coil L1 is supported by the lead holding portions 730*d* extended toward the upper surface. However, the choke coil L1 may be supported by members similar to the lead holding portions 730 in the first embodiment and members similar to the lead holding members 730*d* in the third modified example. For example, the choke coil L1 can be supported by supporting members 750 similar to the lead holding portions 730*d* indicated by alternate long and two short dashes lines in FIG. 8A. It is preferable that the choke coil L1 is supported in a direction different from the direction of extracting leads 822 as in this case in view of avoiding bending stress applied to the leads 822. In this structure, the choke coil L1 is fixed to the supporting members 750 by adhesive or the like. It is possible to use both the lead supporting portions 730*d* in the third modified example and the supporting members 750 at the same time.

C4. Pedestal in Fourth Modified Example

Figure 9A:
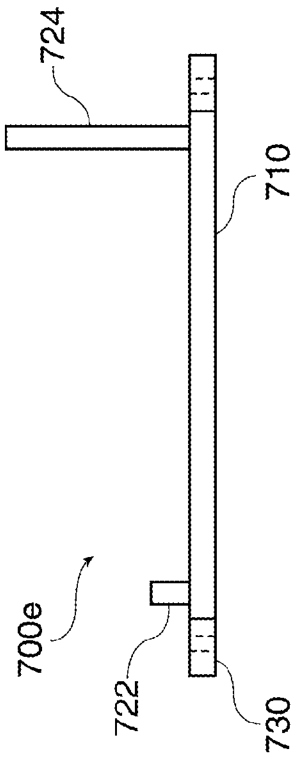
FIGS. 9A and 9B illustrate a pedestal according to a fourth modified example.
Figure 9B:
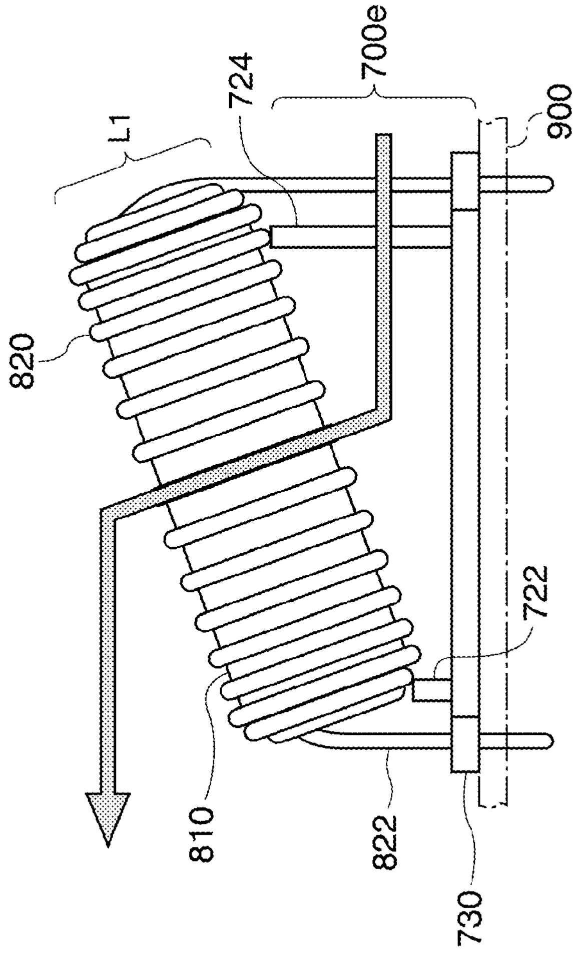

FIGS. 9A and 9B show a pedestal in a fourth modified example. As shown in FIG. 9A, a pedestal 700*e* in the fourth modified example includes pins 722 and 724 having different heights at positions close to the two lead holding portions 730. Thus, the choke coil L1 attached to the upper side of the pedestal 700*e* is fixed with inclination to the disk 710 and the substrate 900 as shown in FIG. 9B. The description "the toroidal direction of the choke coil L1 is substantially parallel with the substrate" includes the condition in which the choke coil L1 is obliquely attached as shown in FIGS. 9A and 9B.

According to the fourth modified example, the choke coil L1 is fixed with inclination to the disk 710. In this case, air from the right in the figure passes the center of the toroidal core 810 and flows from the lower surface toward the upper surface as indicated by an arrow in FIG. 9B. Thus, cooling efficiency in forced air cooling can be sufficiently increased.

In the example shown in FIGS. 9A and 9B, the pins 722 and 724 are provided at positions close to the lead holding portions 730, and the leads 822 are extracted in the arrangement direction of the pins 722 and 724. It is more preferable, however, that the extracting direction of the leads 822 is different from the arrangement direction of the pins 722 and 724 in view of prevention of bending stress applied to the leads 822.

D. Mounting in Modified Example

Figure 10:
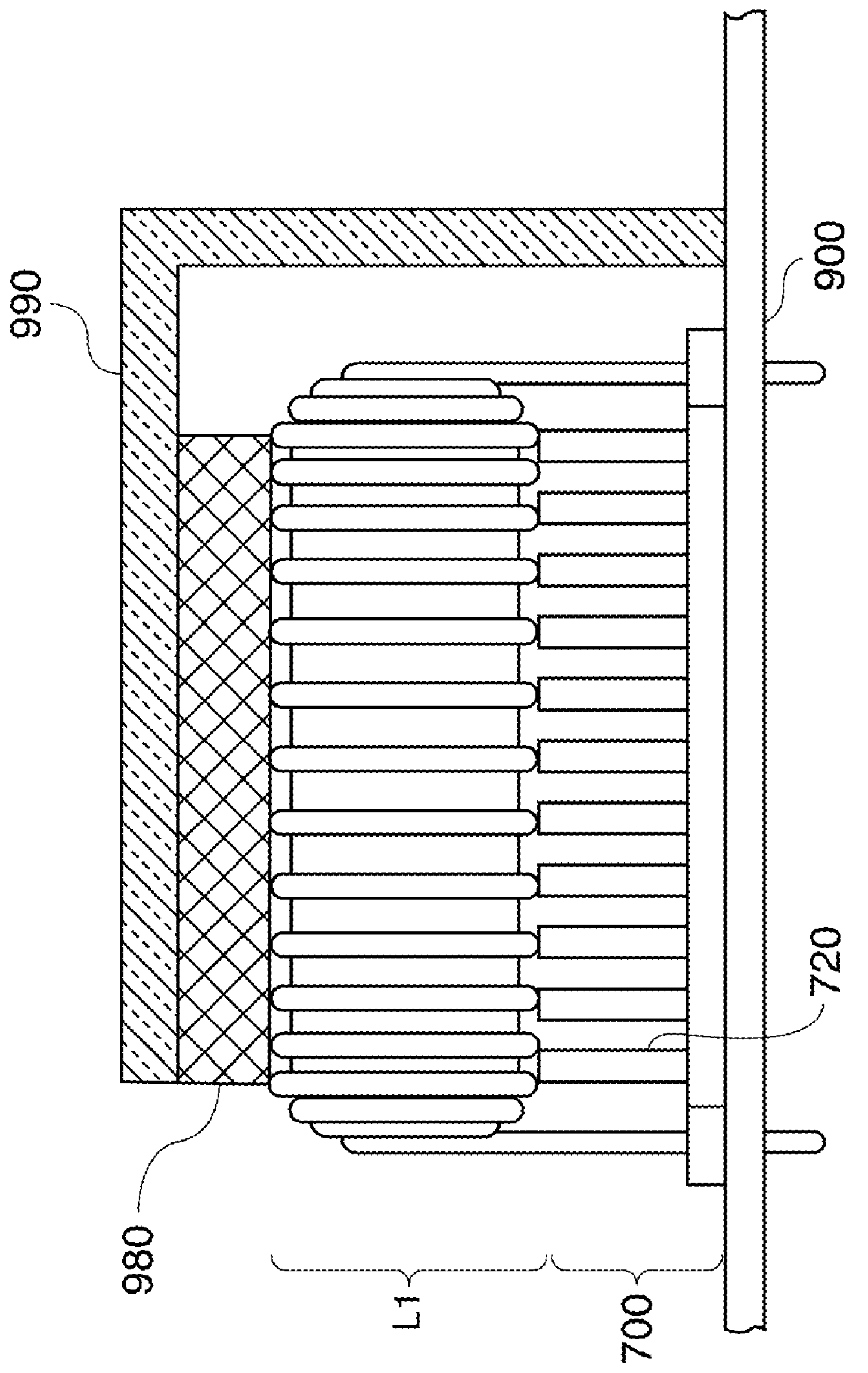
FIG. 10 illustrates a choke coil mounted on a substrate according to a modified example.

FIG. 10 shows a condition of the choke coil L1 mounted on the substrate 900 according to a modified example. The choke coil L1 and the pedestal 700 (coil assembly) according to the mounting in this modified example shown in FIG. 10 are similar to those in the first embodiment. In the example shown in FIG. 10, however, a heat conductive sheet 980 and a heat sink 990 fixed to the substrate 900 are attached to the upper surface of the choke coil L1. The heat sink 990 is fixed to the substrate 900 by screw (not shown) or the like.

In the example shown in FIG. 10, a space is similarly produced on the lower surface side of the choke coil L1. Thus, the choke coil L1 is cooled by air flowing on the lower surface of the choke coil L1 as well as heat conduction by the heat conductive sheet 980 and the heat sink 990. Accordingly, cooling of the choke coil L1 can be further promoted. In the example shown in FIG. 10, it is similarly preferable that the pedestal 700 and the pins 720 are formed by heat conductive resin in view of achieving higher cooling efficiency.

Moreover, the distance between the choke coil L1 and the substrate 900 (mounting height) can be more easily changed by adequately adjusting the length of the pins 720 on the pedestal 700. For adjusting the mounting height, a spacer may be additionally provided between the pedestal 700 and the substrate 900. According to the example shown in FIG. 10, the choke coil L1 can be sufficiently cooled by the heat conduction from the heat conductive sheet 980 and the heat sink 990 and the air passing the lower surface of the choke coil L1 even when the spacer is added between the pedestal 700 and the substrate 900.

E. Other Modified Examples

The invention is not limited to the embodiments and examples described herein, but may be practiced otherwise without departing from the scope and spirit of the invention. For example, the following modifications may be made.

E1. Modified Example 1

While the invention has been applied to a toroidal coil in the embodiments, the invention is applicable to various types of coil other than the toroidal coil. For example, the invention can be applied to a coil having windings wound around a bar-shaped or E-shaped core. Generally, heat generated on the coil is chiefly constituted by Joule heat on the windings. Thus, by mounting the coil on the pedestal, the windings producing a large volume of heat can be efficiently cooled, and efficiency of cooling the coil can be further increased.

E2. Modified Example 2

While the invention is applied to the choke coil L1 of the back converter (FIG. 2), the invention is applicable to coils included in various switching power supplies. More specifically, the invention is applicable to a choke coil included in a boost converter, a choke coil included in a back-boost converter, a flyback transformer included in a flyback type converter, an insulation transformer included in an insulation type converter, or other coils included in various switching power supplies. In these switching power supplies, the choke coil and transformer are disposed on the flow path of source current, and relatively high current flows in these transformer units. By disposing these coils on the pedestal to promote cooling of the coils, miniaturization of coils, increase in inductance, higher degree of freedom for disposition, and reduction of power for cooling can be achieved. Also, the invention is applicable to various types of coil generating a large volume of heat such as common mode transformer and choke coil included in noise filter or the like.

E3. Modified Example 3

While the projector 1000 (FIG. 1) includes the liquid crystal panel 500 as the light modulation unit in the respective embodiments, the light modulation unit may be other modulation units such as DMD (digital micromirror device: trademark of Texas Instruments Co.).

What is claimed is:

1. A switching power supply, comprising:
a coil;
a substrate; and
a pedestal fixed to the coil, the pedestal including a plate-like portion contacting the substrate,
wherein:
the pedestal includes a plurality of supporting members extending between a surface of the plate-like portion opposite the substrate and the coil,
the plurality of supporting members supports the coil in such a manner as to form a space between the surface of the plate-like portion opposite the substrate and the coil through which air flows on a surface of the coil.

2. The switching power supply according to claim 1, wherein
the coil is a toroidal coil,
the pedestal is configured to support the coil such that the toroidal direction of the coil is substantially parallel with a substrate on which the coil is provided.

3. The switching power supply according to claim 2, wherein
each of the plurality of supporting members extends in the direction opposite to the substrate from the plate-like portion.

4. The switching power supply according to claim 3, wherein
a through hole penetrated through the coil side and the substrate side is provided on each of the plate-like portion and the substrate in an area containing a position corresponding to a hole of the coil.

5. A coil assembly, comprising:
a coil;
a substrate; and
a pedestal fixed to the coil, the pedestal including a plate-like portion contacting the substrate,
wherein:
the pedestal includes a plurality of supporting members extending between a surface of the plate-like portion opposite the substrate and the coil,
the plurality of supporting members supports the coil in such a manner as to form a space between the surface of the plate-like portion opposite the substrate and the coil through which air flows on a surface of the coil.

6. The coil assembly according to claim 5, wherein
the coil is a toroidal coil,
the pedestal is configured to support the coil such that the toroidal direction of the coil is substantially parallel with a substrate on which the coil assembly is provided.

7. The coil assembly according to claim 6, wherein
each of the plurality of supporting members extends in the direction opposite to the substrate from the plate-like portion.

8. The coil assembly according to claim 7, wherein
a through hole penetrated through the coil side and the substrate side is provided on each of the plate-like portion and the substrate in an area containing a position corresponding to a hole of the coil.

9. The coil assembly according to claim 5, wherein each of the plurality of supporting members is made of heat conductive resin.

10. A projector comprising the switching power supply according to claim 1.

11. The projector according to claim 10, wherein
the coil is a toroidal coil,
the pedestal is configured to support the coil such that the toroidal direction of the coil is substantially parallel with a substrate on which the coil is provided.

12. The projector according to claim 11, wherein
each of the plurality of supporting members extends in the direction opposite to the substrate from the plate-like portion.

13. The projector according to claim 12, wherein
a through hole penetrated through the coil side and the substrate side is provided on each of the plate-like portion and the substrate in an area containing a position corresponding to a hole of the coil.

* * * * *